US006720684B2

(12) United States Patent
Czimmek

(10) Patent No.: US 6,720,684 B2
(45) Date of Patent: Apr. 13, 2004

(54) METHOD OF CONTROL FOR A SELF-SENSING MAGNETOSTRICTIVE ACTUATOR

(75) Inventor: Perry Robert Czimmek, Williamsburg, VA (US)

(73) Assignee: Siemens Automotive Corporation, Auburn Hills, MI (US)

(*) Notice: Subject to any disclaimer, the term of this patent is extended or adjusted under 35 U.S.C. 154(b) by 0 days.

(21) Appl. No.: 09/813,912

(22) Filed: Mar. 22, 2001

(65) Prior Publication Data

US 2002/0057156 A1 May 16, 2002

Related U.S. Application Data

(60) Provisional application No. 60/191,150, filed on Mar. 22, 2000.

(51) Int. Cl.[7] .......................... H01L 41/06; H01L 41/12
(52) U.S. Cl. .......................... 310/26; 318/118
(58) Field of Search ................ 310/26; 318/118; 335/215

(56) References Cited

U.S. PATENT DOCUMENTS

| 3,654,540 | A |   | 4/1972 | Honig et al. | 318/118 |
|---|---|---|---|---|---|
| 3,857,081 | A |   | 12/1974 | Gebelein, Jr. | 318/687 |
| 4,584,980 | A |   | 4/1986 | Weiger et al. | 123/458 |
| 4,585,978 | A |   | 4/1986 | Hasselmark et al. | 318/118 |
| 4,656,400 | A |   | 4/1987 | Pailthorp et al. | 318/135 |
| 4,659,969 | A |   | 4/1987 | Stupak, Jr. | 318/128 |
| 5,249,117 | A |   | 9/1993 | Greenough et al. | 700/30 |
| 5,280,773 | A |   | 1/1994 | Henkel | 123/467 |
| 5,479,902 | A |   | 1/1996 | Wirbeleit et al. | 123/498 |
| 5,698,911 | A | * | 12/1997 | Dunfield et al. | 310/12 |
| 5,713,326 | A |   | 2/1998 | Huber | 123/299 |
| 5,819,710 | A |   | 10/1998 | Huber | 123/498 |
| 5,915,361 | A |   | 6/1999 | Heinz et al. | 123/467 |
| 5,991,143 | A |   | 11/1999 | Wright et al. | 361/187 |
| 6,028,382 | A | * | 2/2000 | Blalock et al. | 310/68 C |
| 6,152,372 | A | * | 11/2000 | Colley et al. | 235/472.01 |
| 6,176,207 | B1 | * | 1/2001 | Wright et al. | 123/90.11 |
| 6,181,036 | B1 | * | 1/2001 | Kazama et al. | 310/68 B |
| 6,208,497 | B1 | * | 3/2001 | Seale et al. | 361/160 |
| 6,288,536 | B1 | * | 9/2001 | Mandl et al. | 324/225 |

FOREIGN PATENT DOCUMENTS

| EP | 0 443 873 |   | 8/1991 |
| JP | 04004776 A | * | 1/1992 |
| WO | 85/02445 |   | 6/1985 |

OTHER PUBLICATIONS

English translation of Japanese reference H4–4776, published Jan. 1992, title "Magnetostrictive Element Driver", inventor Kaysuya Uemura et al.*
PCT International Search Report; PC/US01/09077; Mar. 1, 2002.
"Self–Sensing Magnetostrictive Actuator for Adaptive Optics", Jones L.D. et al., Journal of Guidance, Control, and Dynamics, vol. 19, No. 3, 1996, pp. 713–715, month unknown.
"Testing of a Magneto–Strictive Actuator for Adaptive Optics", Bigelow B.C. et al., Optical Telescopes of Today and Tomorrow, Landskrona/HVEN, Sweden, May 29–Jun. 2, 1996, vol. 2871, pp. 910–919.

* cited by examiner

Primary Examiner—Nicholas Ponomarenko
Assistant Examiner—Judson H. Jones

(57) ABSTRACT

A method of controlling the amount of magnetostriction in a magnetostrictive actuator is provided. The method compensates for non-ideal influences, such as imperfections in the magnetostrictive member, prestress, stress or load, quality of the magnetic circuit, and temperature. The method includes selectively energizing the coil to build and maintain a current for generating the magnetizing force; measuring the magnetic flux; and applying the magnetic flux as a feedback variable to control the magnetizing force and thereby control the amount of magnetostriction.

15 Claims, 4 Drawing Sheets

METHOD OF CONTROL FOR A SELF-SENSING MAGNETOSTRICTIVE ACTUATOR

CROSS REFERENCE TO RELATED APPLICATIONS

This application claims the benefit of U.S. Provisional Application No. 60/191,150 filed Mar. 22, 2000, which is hereby incorporated by reference in its entirety.

FIELD OF THE INVENTION

This invention relates to magnetostrictive actuators, and particularly to magnetostrictive fuel injectors and electronic valve timing actuators for internal combustion engines. More particularly, this invention relates to an apparatus and method of using magnetic flux as a feedback variable to control the level of magnetostriction in a magnetostrictive actuator.

BACKGROUND OF THE INVENTION

It is believed that magnetostrictive actuators typically comprise a magnetostrictive member positioned within a solenoid coil, and a prestress mechanism for loading the magnetostrictive member to the nominal prestress value required to produce maximum magnetostriction. In the case of Terfenol-D, for example, it is believed that the magnetostrictive member may be prestressed to a value of about 7.6 MPa to maximize magnetostriction. However, it is believed that prestress may or may not be necessary, depending on the particular application and type of magnetostrictive material. It is believed that the solenoid coil generates the magnetizing force necessary to cause the desired magnetostriction in the magnetostrictive member.

The term "magnetostriction," as it is used in this disclosure, means magnetic contraction, but it is generally understood to encompass the following similar effects associated with ferromagnetic materials: the Guillemin Effect, which is believed to be the tendency of a bent ferromagnetic rod to straighten in a longitudinal magnetic field; the Wiedemann Effect, which is believed to be is the twisting of a rod carrying an electric current when placed in a magnetic field; the Joule Effect, which is believed to be a gradual increasing of length of a ferromagnetic rod when subjected to a gradual increasing longitudinal magnetic field; and the Villari Effect, which is believed to be a change of magnetic induction in the presence of a longitudinal magnetic field (i.e., inverse Joule Effect). It is believed that the Villari Effect is the magnetostriction effect of greatest importance in actuator design. It is believed that typical magnetostrictive actuators utilize the Joule Effect for generating displacement and force.

It is believed that dimensional changes that occur when a ferromagnetic material is placed in a magnetic field are often considered undesirable because of the need for dimensional stability in precision electromagnetic devices. Therefore, it is believed that manufacturers of ferromagnetic alloys often formulate their alloys to exhibit very low magnetostriction effects. It is believed that ferromagnetic materials exhibit magnetic characteristics because of their ability to align magnetic domains. It is further believed that strongly magnetostrictive materials characteristically have domains that are longer in the direction of their polarization and narrower in a direction perpendicular to their polarization, thus allowing the domains to change the major dimensions of the ferromagnetic material when the domains rotate.

Alloys of Terbium (Tb), Dysprosium (Dy), and Iron (Fe) to form $Tb_xDy_{1-x}Fe_2$ are believed to result in a magnetostrictive material in which useful strains may be attained. For example, the magnetostrictive alloy Terfenol-D ($Tb_{0.32}Dy_{0.68}Fe_{1.92}$), is believed to be capable of approximately 10 μm displacements for every 1 cm of length exposed to an approximately 500 Oersted magnetizing field. The general equation for magnetizing force, H, in Ampere-Turns per meter (1 Oersted=79.6 AT/m) is:

$$H=IN/L$$

where I=Amperes of current; N=number of turns; and L=path length.

It is believed that Terfenol-D is often referred to as a "smart material" because of its ability to respond to its environment and exhibit giant magnetostrictive properties.

While the present disclosure is described primarily with reference to Terfenol-D as the magnetostrictive material, it will be appreciated by those skilled in the art that other alloys having similar magnetostrictive properties may be substituted and are included within the scope of the present disclosure.

SUMMARY OF THE INVENTION

The present invention provides a method of controlling a magnetostrictive actuator. The methol comprises energizing a coil with a current to generate magnetic flux within the coil; measuring the amount of magnetic flux generated in the coil; and applying the amount of magnetic flux generated in the coil as a feedback variable to selectively control the amount of magnetizing force applied to a magnetostrictive member located within the coil.

The present invention also provides a method of controlling a magnetostrictive actuator. The method comprises generating a magnetizing force acting on a magnetostrictive member located within a coil; measuring flux in the magnetostrictive member; and controlling the magnetizing force in response to the measuring flux.

The present invention further provides a magnetostrictive actuator. The actuator comprises a coil; a driver electrically coupled to the coil, the driver supplying current to the coil in an operating state; a magnetostrictive element magnetically coupled to the coil in the operating state; and a sensor magnetically coupled to the magnetostrictive element and electrically coupled to the driver, the sensor detecting magnetic flux in the magnetostrictive element and outputting to the driver a signal adjusting the current supplied to the coil.

BRIEF DESCRIPTION OF THE DRAWINGS

The accompanying drawings, which are incorporated herein and constitute part of this specification, include one or more embodiments of the invention, and together with a general description given above and a detailed description given below, serve to disclose principles of the invention in accordance with a best mode contemplated for carrying out the invention. Like reference numerals are used to indicate like elements throughout the drawings.

DETAILED DESCRIPTION OF THE EMBODIMENTS

Figure 1:
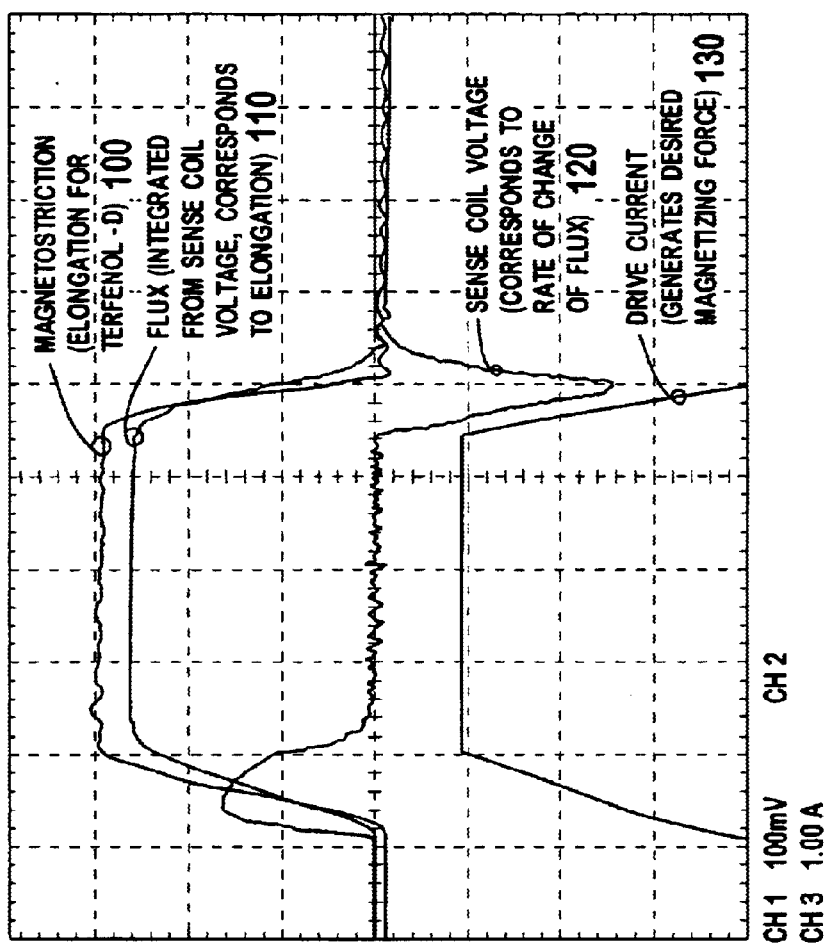
FIG. 1 is a data trace depicting relationships between magnetostriction, magnetic flux, rate of change of magnetic flux and coil drive current with respect to * on an embodiment of a magnetostrictive member.

Embodiments of magnetostrictive actuators will be described primarily in relation to automotive applications (e.g., magnetostrictive electronic valve actuators, and magnetostrictive fuel injectors). However, as will be appreciated by those skilled in the art, these embodiments are not so limited and may be used in any application where magnetostrictive actuators are used.

An example of a magnetostrictive electronic valve actuator is disclosed in U.S. patent application Ser. No. 09/789,576, filed Feb. 22, 2001, and entitled "Magnetostrictive Electronic Valve Timing Actuator," the contents of which is hereby incorporated in its entirety into the present specification by reference. An example of a magnetostrictive fuel injector is disclosed in U.S. patent application Ser. No. 09/608,191, filed Jun. 30, 2000, and entitled "Electronic Fuel Injector Actuated By Magnetostrictive Transduction," the contents of which is hereby incorporated in its entirety into the present specification by reference.

According to one embodiment, a method of selectively controlling the degree of magnetostriction of a magnetostrictive member is disclosed. This method accounts for, and compensates for, non-ideal influences, including for example, imperfections in the magnetostrictive member, the amount of prestress applied to the magnetostrictive member, frictional stresses and loads, the quality of the magnetic circuit, and temperature effects.

In order to improve the performance of magnetostrictive actuators, it is desirable to have feedback regarding the non-ideal forces and influences affecting magnetostrictive performance, as well as feedback regarding the actual degree of magnetostriction achieved. For example, knowledge regarding the degree of magnetostriction enables the magnetostrictive actuator to be calibrated to the operational characteristics of a particular internal combustion engine. Knowledge of the degree of magnetostriction allows deviations in prestress, load and temperature of the actuator to be automatically compensated for so that the level of magnetostriction can be held within a close tolerance.

According to one embodiment, magnetic flux may be used as a feedback variable to control the magnetizing force and thereby control the degree of magnetostriction. A presently preferred method of controlling the degree of magnetostriction of a magnetostrictive member includes selectively energizing the coil to build and maintain the necessary current that generates the magnetizing force. The magnetizing force, which corresponds to a particular degree of magnetostrictive displacement, may then be determined by measuring the flux, or magnetization resulting from the magnetizing force. In this manner, magnetic flux may be used as a feedback variable to control the magnetizing force, and hence, the degree of magnetostriction.

Commercial Terfenol-D is a nearly single crystal material, and although its mechanism of magnetostriction is often correctly described in terms of grain or domain orientation, it is a localized moment material. In localized moment materials, such as a rare-earth ion embedded in a crystal, the underlying atomic spin-orbit coupling which leads to the magnetostriction and magnetic anisotropy (e.g., initial alignment prior to induced magnetoelastic strain) is the non-spherical shape of the electron cloud of the respective rare-earth ion. In Terfenol-D, the oblate electron cloud of Terbium results in an initial anisotropy that causes positive strain axially with the applied magnetic field. While in another giant-magnetostrictive, known as Samfenol-E, the prolate electron cloud of Samarium results in an initial anisotropy that causes negative strain axially with the applied magnetic field. In general, the rare-earth iron alloys, because of their magnetic anisotropy, have very low permeabilities and can have the highest magnetic ordering temperatures (Curie temperatures) of magnetostrictives, as well as stoichiometries which can be adjusted to maximize strain at low magnetic field intensity, H. The Villari Effect behavior of Terfenol-D relates to changes in its magnetic permeability.

Single crystal Terfenol-D is characterized by a magnetic permeability, u, which varies inversely with the applied axial prestress. Further, the magnetic permeability varies inversely with temperature, up to its Curie temperature. Magnetic circuit quality affects relative magnetizing force, and magnetostrictive material imperfections tend to decrease permeability.

From Ampere's Law, it is known that: $NI = \Re \phi$, where N=the number of coil turns; I=the coil current; $\Re$=the reluctance; and $\phi$=magnetic flux. The inverse of reluctance is known as permeance. Permeance is directly proportional to the permeability and the cross sectional area of the material, and inversely proportional to its length. Therefore, as the relative permeability increases, the reluctance decreases. With a lower reluctance and a given NI, the total flux will tend to increase. As flux increases for a given area, the flux density, B, and inductance also increases.

Assuming an increase in flux density due to an increase in total flux, and the relationship: B=uH, then the magnetic field intensity, H, along the rod should increase. If the magnetic field intensity along the Terfenol-D rod increases, with the relation: S=dH, where S is strain, and d is the slope of the magnetostriction curve, then the strain of the rod should increase. Therefore, from changes in flux, changes in magnetostriction can be inferred, while accounting for influences that tend to change flux including the magnetostrictive material quality, the magnetic circuit quality, the prestress or stress, and the temperature. Measuring flux provides information about the above-described non-ideal conditions and allows for the adjustment of magnetizing force by measuring magnetic flux.

Flux can be measured by using any of a number of methods. For example, a Hall-effect sensor 10, Giant Magnetoresistive (GMR) sensor 20, or eddy current sensor 30 may be used. Alternatively, the drive coil (or a sense coil) may be used to sense the time derivative of the flux, $d\phi/dt$, or a parametric measurement method of determining rate of change of flux may be used, such as is taught in U.S. Pat. No. 5,991,143, "Method for Controlling Velocity of an Armature of an Electromagnetic Actuator," by Wright and Czimmek, which is hereby incorporated in its entirety by reference.

According to a presently preferred embodiment, magnetic flux is used as a feedback variable that indicates the level of the magnetizing force provided by a solenoid coil to a magnetostrictive member, thereby allowing for the control of a magnetostrictive actuator by taking advantage of the actuator's self sensing Villari Effect. The Villari Effect (the inverse of the Joule Effect) may therefore serve as a convenient error indicator by measuring deviations from the desired displacement and force.

According to a presently preferred embodiment, flux may be derived by integrating the rate of change of flux, $d\phi/dt$. Rate of change of flux may be determined by measuring the voltage across a sense coil, or alternatively, by measuring the voltage across the inactive drive coil in a two coil actuator. In either method, the resulting voltage will be proportional to the voltage found by Maxwell's Equation (i.e., the EMF of a coil having N number of turns equals the product of the number of turns times the rate of change of flux in the coil, V=N dφ/dt).

According to an alternate embodiment, voltage across the drive coil of the magnetostrictive actuator can be used to measure the rate of change of flux by applying Kirchoff's Voltage Law (i.e., the voltage across the current source must at all times equal the sum of the IR drop and the counter EMF, V=N dφ/dt+IR). The IR drop (i.e., the product of current and resistance, contributing voltage) across the coil must be subtracted from the drive coil voltage to derive the correct voltage representing time rate of change of flux.

FIG. 1 is a data trace depicting the degree of magnetostriction 100, as determined by a position sensor as a reference; the amount of magnetic flux 110, as determined by integrating the voltage from a sense coil (or inactive drive coil in a two coil actuator); the sense coil voltage 120, which corresponds to the rate of change of magnetic flux; the drive current 130, which provides the magnetizing force and is the variable changed by feedback information determined from the magnetic flux feedback variable. The magnetic flux curve is generally monotonic and has a shape much like the magnetostriction curve.

Figure 2:
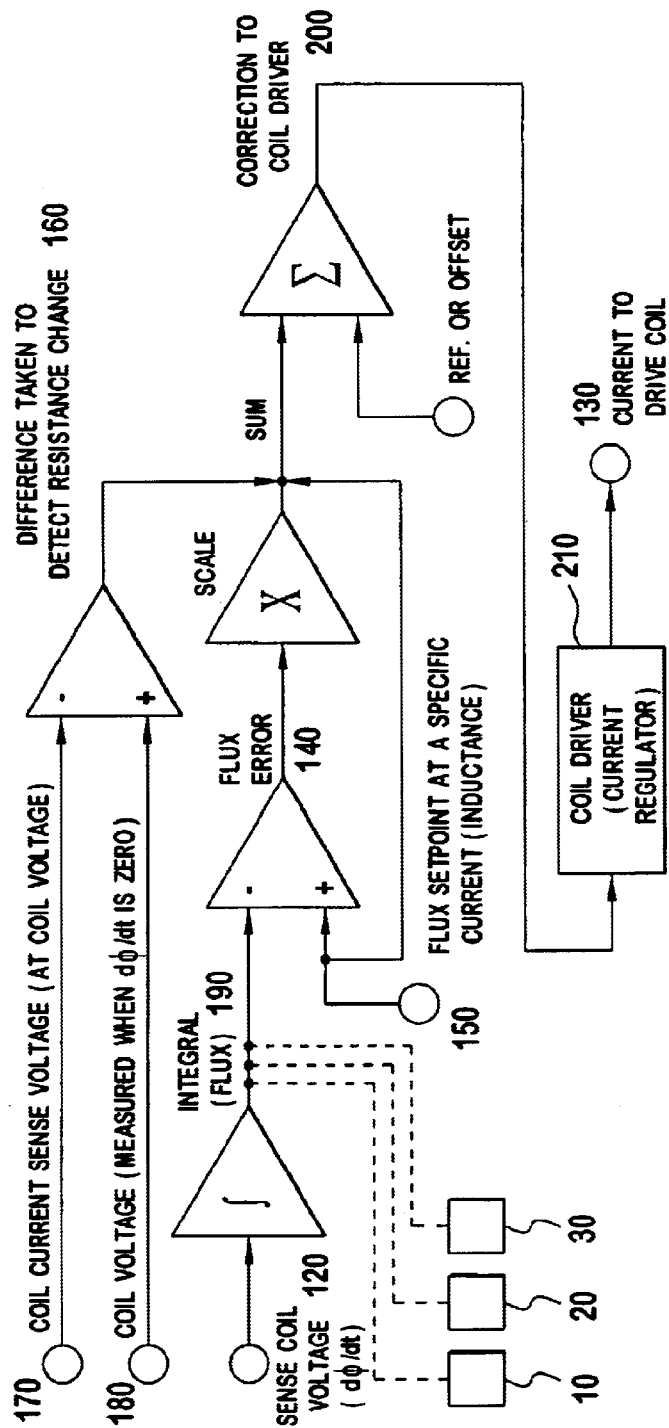
FIG. 2 illustrates a block diagram of a controller according to an embodiment of a magnetostrictive member.

FIG. 2 depicts a block diagram of a method of control for a self sensing magnetostrictive actuator according to one embodiment. Referring to FIG. 2, changes in prestress, stress or load, magnetostrictive material quality or magnetic circuit quality, may result in a change in flux that may be detected as an error 140 in the flux compared to a flux setpoint 150 at a particular current level (this is the inductance check based on L=φ/I, which detects changes in permeability due to the Villari Effect with changing stresses or due to changes in total flux in the circuit due to changes in the circuit reluctance).

Changes in temperature also result in changes in magnetic flux. This may be compounded by thermal demagnetization up to the Curie temperature (at the Curie temperature, magnetostriction and magnetization are essentially zero due to local moment randomization, also known as "thermal fuzzing"). While flux correction factor may be used to compensate the magnetostriction for a portion of the thermal effects, further compensation is necessary to account for the thermal demagnetization. The temperature influence may be accounted for in two ways. First the temperature influence may be detected as an error in magnetic flux at a given current. Second the temperature influence may be detected as a resistance change 160 of the solenoid coil. This resistance change allows for differentiation between thermal and other effects, and provides a method of adding further compensation based on the magnitude of the resistance change due to temperature.

The resistance of a coil can be derived from Ohm's Law, R=V/I. This, however, requires either an analog or digital divide. In a magnetostrictive actuator, the current is not generally available to measure directly. Rather, current is usually measured indirectly as a signal from a current sensor such as a sense resistor, current transformer, or Hall-effect current probe. It is generally most convenient to scale a voltage 170 proportional to current and then add or subtract it from a voltage 180 representing only the IR drop across the drive coil at the measured drive current. When the temperature does not affect magnetostriction, it may be convenient to have the coil voltage 180 minus the coil current sense voltage 170 set to equal zero, thereby contributing no correction to the flux level. Additional correction due to temperature may be necessary only when extreme precision is needed, otherwise corrections are usually based only on flux error 140.

In order to correct a variation in flux 190, the variation must be identified and, depending on whether it is a positive variation or a negative variation, it must be added or subtracted from the flux setpoint level 150. The total may be added to any necessary thermal correction and the new setpoint correction 200 becomes the new flux level attained by the coil driver 210. Initially, the coil driver 210 may build flux to a certain current level, an inductance check may be performed by comparing an initial setpoint flux 150 at the certain current level, deviations from the initial setpoint flux may be added to the setpoint flux 150 and this new setpoint flux is what the coil driver 210 then moves toward. At a new current level, when dφ/dt is zero (or subtracted according to Kirchoff's Voltage Law), the voltage across the active drive coil at the certain current level is measured and a resistance check is made, indicating temperature deviations. Needed correction due to temperature is also then added to the new setpoint flux.

Figure 3:
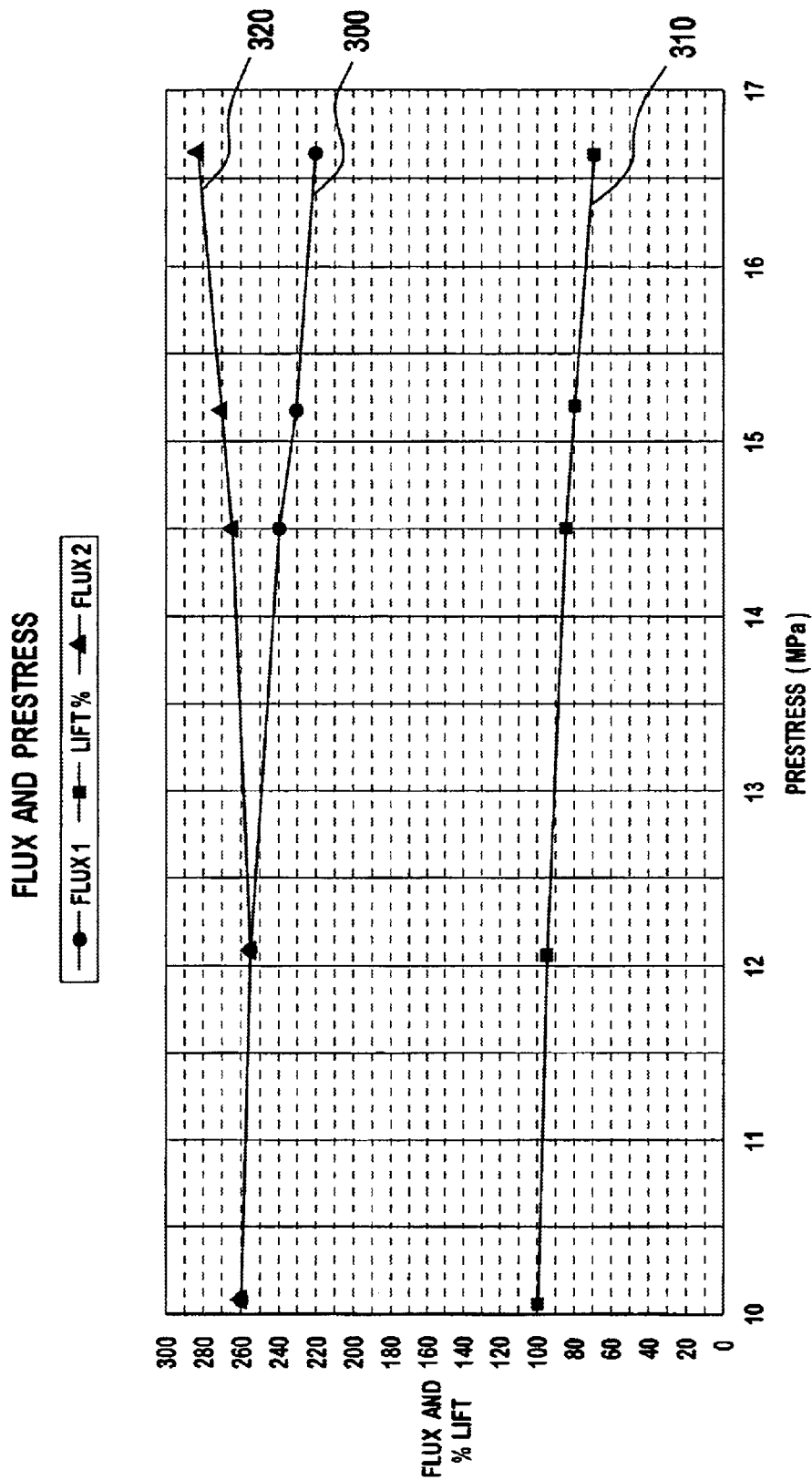
FIG. 3 illustrates relationships between magnetic flux and lift with respect to prestress on an embodiment of a magnetostrictive member.

FIG. 3 shows data demonstrating the compensation when only prestress is varied (detected through the self-sensing Villari Effect). "Flux 1" 300 is the uncorrected flux as prestress increases, indicating the decrease in lift (magnetostriction) shown by "Lift %" 310. "Flux 2" 320 is the corrected flux, at a level necessary to keep the lift the same (no decrease in magnetostriction).

Figure 4:
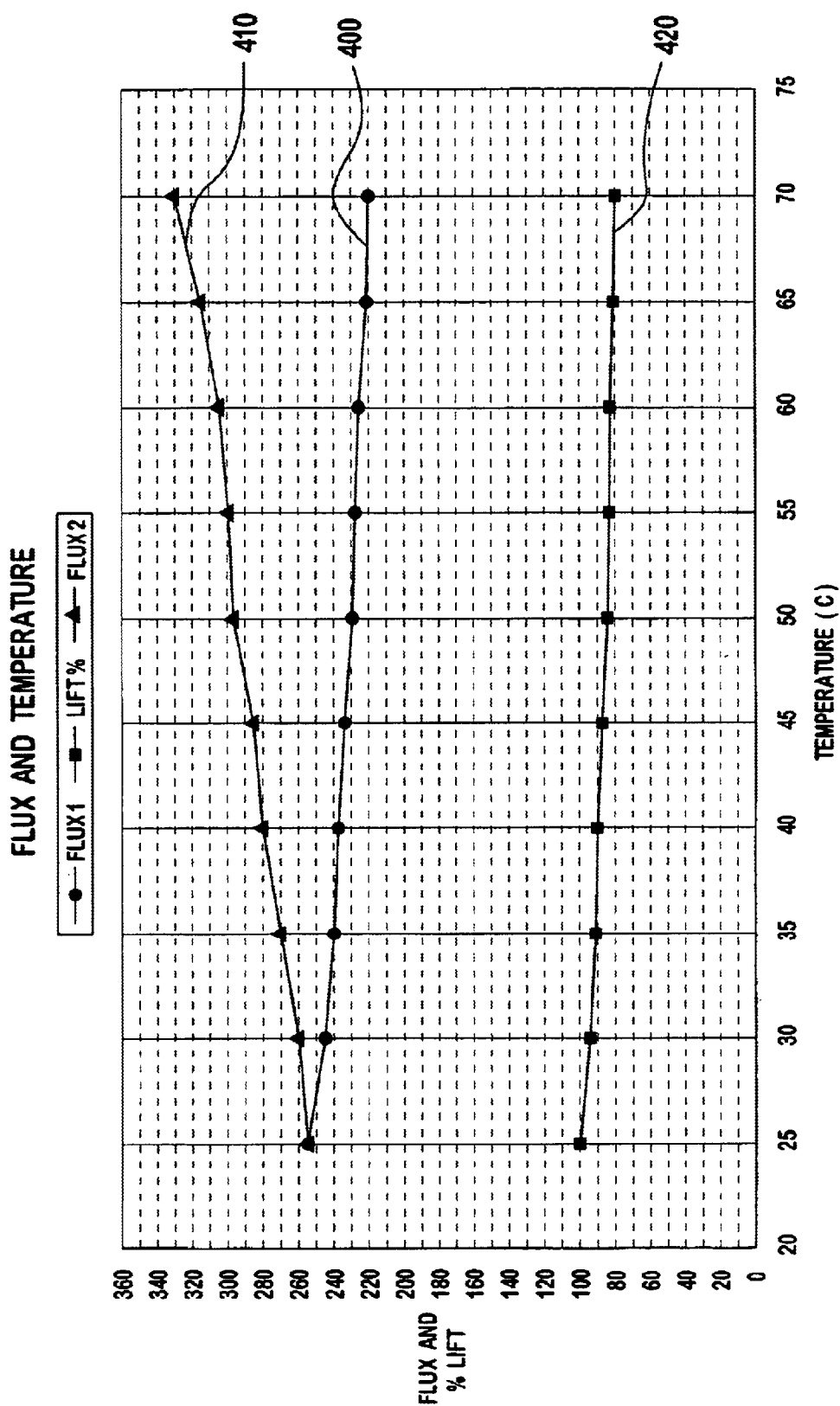
FIG. 4 illustrates relationships between magnetic flux and lift with respect to temperature on an embodiment of a magnetostrictive member.

FIG. 4 shows data demonstrating the compensation when only temperature is varied (detected through both a resistance change and a decrease in flux). "Flux 1" 400 is the uncorrected flux as temperature increases, indicating the decrease in lift (magnetostriction) shown by "Lift %" 410. "Flux 2" 420 is the corrected flux, both corrected for the decrease in flux and the increase in coil resistance due to temperature, at a level necessary to maintain a nearly constant lift the same (no decrease in magnetostriction).

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined in the appended claims.

What is claimed is:

1. A method of controlling a magnetostrictive actuator, the method comprising:

energizing a coil with a current to generate magnetic flux within the coil;

measuring the amount of magnetic flux generated in the coil; and applying the magnetic flux generated in the coil as feedback variable to selectively control the amount of magnetizing force applied to a magnetostrictive member located within the coil.

2. A method of controlling a magnetostrictive actuator having a current driver, a coil electrically coupled to the driver and a magnetostrictive member proximate to the coil, the magnetostrictive member being responsive to a magnetizing force generated by the coil, the method comprising:

measuring a flux set point at a predetermined current level of the coil;

detecting the amount of change in magnetic flux as compared to the flux set point; and applying the amount of change in detected magnetic flux to the current driver as a feedback variable to control the magnetizing force.

3. The method according to claim 2, wherein the measuring flux comprises sensing with a Hall-effect sensor.

4. The method according to claim 2, wherein the measuring flux comprises sensing with a Giant Magnetoresistive (GMR) sensor.

5. The method according to claim 2, wherein the measuring flux comprises sensing with an eddy current sensor.

6. The method according to claim 2, wherein the measuring flux comprises integrating a time-derivative of magnetic flux.

7. The method according to claim 6, wherein the integrating comprises measuring a voltage across a sense coil to determine the time-derivative of magnetic flux.

8. A method of controlling a magnetostrictive actuator, the method comprising:

energizing a coil with a current to generate magnetic flux within the coil;

measuring the amount of magnetic flux generated in the coil, the measuring flux comprises integrating a time-derivative of magnetic flux, the integrating includes measuring a voltage across an inactive one of two drive coils to determine the time-derivative of magnetic flux; and applying the amount of magnetic flux generated in the coil as feedback variable to selectively control the amount of magnetizing force applied to a magnetostrictive member located within the coil.

9. The method according to claim 2, wherein the applying the amount of magnetic flux further comprises correcting for thermal variations.

10. The method according to claim 9, wherein the correcting for thermal variations comprises adding a thermal correction factor to a first setpoint level to generate a second setpoint level.

11. A method of controlling a magnetostrictive actuator, the method comprising:

energizing a coil with a current to generate magnetic flux within the coil;

measuring the amount of magnetic flux generated in the coil; and applying the amount of magnetic flux generated in the coil as a feedback variable to selectively control the amount of magnetizing force applied to the magnetostrictive member located within the coil, and includes correcting for thermal variations, the correcting for thermal variations includes adding a thermal correction factor to a first setpoint level to generate a second setpoint level, wherein the thermal correction factor is determined based on resistance of the coil.

12. The method according to claim 11, wherein the resistance of the coil is determined by dividing voltage across the coil by a voltage drop across a sense resistor which is proportional to current through the coil.

13. The method according to claim 12, wherein the coil resistance is determined when the time derivative of flux is zero and the drive coil current is not zero.

14. The method according to claim 11, wherein the resistance of the coil is approximately by subtracting voltage across the coil from a voltage which is proportional to the current through the coil.

15. The method to claim 14, wherein the coil resistance is determined when the time derivative of flux is zero and the drive coil current is not zero.

* * * * *